(12) United States Patent
Fu

(10) Patent No.: US 6,497,802 B2
(45) Date of Patent: *Dec. 24, 2002

(54) SELF IONIZED PLASMA SPUTTERING

(75) Inventor: Jianming Fu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/918,135

(22) Filed: Jul. 30, 2001

(65) Prior Publication Data

US 2001/0052456 A1 Dec. 20, 2001

Related U.S. Application Data

(62) Division of application No. 09/249,468, filed on Feb. 12, 1999, now Pat. No. 6,290,825.

(51) Int. Cl.[7] .............................................. C23C 14/34
(52) U.S. Cl. ................................ 204/298.2; 204/298.16
(58) Field of Search ........................ 204/298.16, 298.17, 204/298.19, 298.2, 298.21, 298.22, 192.12, 192.15

(56) References Cited

U.S. PATENT DOCUMENTS

| | | | |
|---|---|---|---|
| 4,239,611 A | 12/1980 | Morrison, Jr. | 204/298 |
| 4,312,731 A | 1/1982 | Morrison, Jr. | 204/192 R |
| 4,601,806 A | 7/1986 | Wirz | 204/298 |
| 4,652,358 A | 3/1987 | Deppisch et al. | 204/298 |
| 4,746,417 A | 5/1988 | Ferenbach et al. | 204/298 |
| 4,810,346 A | 3/1989 | Wolf et al. | 204/298 |
| 4,818,561 A | 4/1989 | Strahl | 427/38 |
| 4,872,964 A | 10/1989 | Suzuki et al. | 204/298 |
| 4,943,361 A | 7/1990 | Kakehi et al. | 204/192.32 |
| 4,963,239 A | 10/1990 | Shimamura et al. | 204/192.12 |
| 5,026,471 A | 6/1991 | Latz et al. | 204/298.19 |

(List continued on next page.)

FOREIGN PATENT DOCUMENTS

| | | | |
|---|---|---|---|
| EP | 0 620 583 A 1 | | 10/1994 |
| JP | 62-89864 | | 4/1987 |
| JP | 62-230971 | | 10/1987 |
| JP | 63-282263 | | 11/1988 |
| JP | 64-28921 | | 1/1989 |
| JP | 1-268868 | | 10/1989 |
| JP | 5-1373 | | 1/1993 |
| JP | 5-325705 | | 12/1993 |
| JP | 7-126844 | | 5/1995 |
| JP | 7-166346 | | 6/1995 |
| JP | 7-252651 | | 10/1995 |
| JP | 9-41135 | | 2/1997 |
| JP | 9 041 135 A | * | 2/1997 |
| JP | 10 088 339 A | * | 4/1998 |
| JP | 10 152 774 A | * | 6/1998 |
| JP | 11-74225 | | 3/1999 |

OTHER PUBLICATIONS

Musil et al., "Unbalanced magnetrons and new sputtering systems with enhanced plasma ionization", *J. Vac. Sci. Technol. A*, vol. 9, No. 3, May/Jun. 1991, pp. 1171–1177.

Posadowski et al., "Sustained self–sputtering using a direct current magnetron source," *Journal of Vacuum Science and Technology A*, vol. 11, No. 6, Nov/Dec 1993, pp. 2980–2984.

*Primary Examiner*—Patrick Ryan
*Assistant Examiner*—Gregg Cantelmo
(74) *Attorney, Agent, or Firm*—Charles S. Guenzer, Esq.

(57) ABSTRACT

A magnetron especially advantageous for low-pressure plasma sputtering or sustained self-sputtering having reduced area but full target coverage. The magnetron includes an outer pole of one magnetic surrounding an inner pole of the other polarity with a gap therebetween. The magnetron is small, primarily located on one side of the central axis, about which it is rotated. The total magnetic flux of the outer pole is at least 1.5 times that of the inner pole. Different shapes include a racetrack, an ellipse, an egg shape, a triangle, and a triangle with an arc conforming to the target periphery. The invention allows increased ionization of the sputtered atoms.

11 Claims, 9 Drawing Sheets

U.S. PATENT DOCUMENTS

| | | | |
|---|---|---|---|
| 5,047,130 A | 9/1991 | Akao et al. | 204/192.12 |
| 5,120,417 A | 6/1992 | Takahashi et al. | 204/192.12 |
| 5,242,566 A | 9/1993 | Parker | 204/298.2 |
| 5,248,402 A | 9/1993 | Ballentine et al. | 204/298.2 |
| 5,252,194 A | 10/1993 | Demaray et al. | 204/298.2 |
| 5,262,028 A | 11/1993 | Manley | 204/192.12 |
| 5,284,564 A | 2/1994 | Maass | 204/298.2 |
| 5,320,728 A | 6/1994 | Tepman | 204/192.12 |
| 5,322,605 A | 6/1994 | Yamanishi | 204/298.07 |
| 5,334,302 A | 8/1994 | Kubo et al. | 204/298.18 |
| 5,415,754 A | 5/1995 | Manley | 204/192.12 |
| 5,514,259 A | 5/1996 | Shiota et al. | 204/298.19 |
| 5,536,362 A | 7/1996 | Love et al. | 156/643.1 |
| 5,556,519 A | 9/1996 | Teer | 204/192.12 |
| 5,584,971 A | 12/1996 | Komino | 204/192.13 |
| 5,593,551 A | 1/1997 | Lai | 204/192.12 |
| 5,746,897 A | 5/1998 | Heimanson et al. | 204/298.2 |
| 5,770,025 A | 6/1998 | Kiyota | 204/298.2 |
| 5,795,451 A | 8/1998 | Tan et al. | 204/298.2 |
| 5,824,197 A | 10/1998 | Tanaka | 204/192.12 |
| 5,879,523 A | 3/1999 | Wang et al. | 204/298.11 |
| 5,897,752 A | 4/1999 | Hong et al. | 204/192.12 |
| 5,976,327 A | 11/1999 | Tanaka | 204/192.15 |
| 6,183,614 B1 * | 2/2001 | Fu | 204/298.2 |
| 6,290,825 B1 * | 9/2001 | Fu | 204/298.2 |

* cited by examiner

SELF IONIZED PLASMA SPUTTERING

RELATED APPLICATION

This application is a division of Ser. No. 09/249,468, filed Feb. 12, 1999, now U.S. Pat. No. 6,290,825, issued Sep. 18, 2001.

FIELD OF THE INVENTION

The invention relates generally to sputtering of materials. In particular, the invention relates to the magnet and sputtering conditions used to enhance sputtering.

BACKGROUND ART

Sputtering, alternatively called physical vapor deposition (PVD), is the most prevalent method of depositing layers of metals and related materials in the fabrication of semiconductor integrated circuits. A conventional PVD reactor 10 is illustrated schematically in cross section in FIG. 1, and the illustration is based upon the Endura PVD Reactor available from Applied Materials, Inc. of Santa Clara, Calif. The reactor 10 includes a vacuum chamber 12 sealed to a PVD target 14 composed of the material, usually a metal, to be sputter deposited on a wafer 16 held on a heater pedestal 18. A shield 20 held within the chamber protects the chamber wall 12 from the sputtered material and provides the anode grounding plane. A selectable DC power supply 22 negatively biases the target 14 to about −600 VDC with respect to the shield 20. Conventionally, the pedestal 18 and hence the wafer 16 are left electrically floating.

A gas source 24 supplies a sputtering working gas, typically the chemically inactive gas argon, to the chamber 12 through a mass flow controller 26. In reactive metallic nitride sputtering, for example, of titanium nitride, nitrogen is supplied from another gas source 27 through its own mass flow controller 26. Oxygen can also be supplied to produce oxides such as $Al_2O_3$. The gases can be admitted to the top of the chamber, as illustrated, or at its bottom, either with one or more inlet pipes penetrating the bottom of the shield or through the gap between the shield 20 and the pedestal 18. A vacuum system 28 maintains the chamber at a low pressure. Although the base pressure can be held to about $10^{-7}$ Torr or even lower, the pressure of the working gas is typically maintained at between about 1 and 1000 mTorr. A computer-based controller 30 controls the reactor including the DC power supply 22 and the mass flow controllers 26.

When the argon is admitted into the chamber, the DC voltage between the target 14 and the shield 20 ignites the argon into a plasma, and the positively charged argon ions are attracted to the negatively charged target 14. The ions strike the target 14 at a substantial energy and cause target atoms or atomic clusters to be sputtered from the target 14. Some of the target particles strike the wafer 16 and are thereby deposited on it, thereby forming a film of the target material. In reactive sputtering of a metallic nitride, nitrogen is additionally admitted into the chamber 12 and it reacts with the sputtered metallic atoms to form a metallic nitride on the wafer 16.

To provide efficient sputtering, a magnetron 32 is positioned in back of the target 14. It has opposed magnets 34, 36 creating a magnetic field within the chamber in the neighborhood of the magnets 34, 36. The magnetic field traps electrons and, for charge neutrality, the ion density also increases to form a high-density plasma region 38 within the chamber adjacent to the magnetron 32. The magnetron 32 is usually rotated about the center of the target 14 to achieve full coverage in sputtering of the target 14. The form of the magnetron is a subject of this patent application, and the illustrated form is intended to be only suggestive.

The advancing level of integration in semiconductor integrated circuits has placed increasing demands upon sputtering equipment and processes. Many of the problems are associated with contact and via holes. As illustrated in the cross-sectional view of FIG. 2, via or contact holes 40 are etched through an interlevel dielectric layer 42 to reach a conductive feature 44 in the underlying layer or substrate 46. Sputtering is then used to fill metal into the hole 40 to provide inter-level electrical connections. If the underlying layer 46 is the semiconductor substrate, the filled hole 40 is called a contact; if the underlying layer is a lower-level metallization level, the filled hole 40 is called a via. For simplicity, we will refer hereafter only to vias. The widths of inter-level vias have decreased to the neighborhood of 0.25 μm and below while the thickness of the inter-level dielectric has remained nearly constant at around 0.7 μm. That is, the via holes have increased aspect ratios of three and greater. For some advanced technologies, aspect ratios of six and even greater are required.

Such high aspect ratios present a problem for sputtering because most forms of sputtering are not strongly anisotropic so that the initially sputtered material preferentially deposits at the top of the hole and may bridge it, thus preventing the filling of the bottom of the hole and creating a void in the via metal.

It has become known, however, that deep hole filling can be facilitated by causing a significant fraction of the sputtered particles to be ionized in the plasma between the target 14 and the pedestal 18. The pedestal 18 of FIG. 1, even if it is left electrically floating, develops a DC self-bias, which attracts ionized sputtered particles from the plasma across the plasma sheath adjacent to the pedestal 18 and deep into the hole. Two associated measures of the effective of hole filling are bottom coverage and side coverage. As illustrated schematically in FIG. 2, the initial phase of sputtering deposits a layer 50, which has a surface or blanket thickness of $s_1$, a bottom thickness of $s_2$, and a sidewall thickness of $s_3$. The bottom coverage is equal to $s_2/s_1$, and the sidewall coverage is equal to $s_3/s_1$. The model is overly simplified but in many situations is adequate.

One method of increasing the ionization fraction is to create a high-density plasma (HDP), such as by adding an RF coil around the sides of the chamber 12 of FIG. 1. An HDP reactor not only creates a high-density argon plasma but also increases the ionization fraction of the sputtered atoms. However, HDP PVD reactors are new and relatively expensive. It is desired to continue using the principally DC sputtering of the PVD reactor of FIG. 1.

Another method for increasing the ionization ratio is to use a hollow-cathode magnetron in which the target has the shape of a top hat. This type of reactor, though, runs very hot and the complexly shaped targets are very expensive.

It has been observed that copper sputtered with either an inductively coupled HDP sputter reactor or a hollow-cathode reactor tends to form an undulatory film on the via sidewall and the deposited metal tends to dewet. This is particularly serious when the sputtered copper layer is being used as a seed layer for a subsequent deposition process such as electroplating to complete the copper hole filling.

A further problem in the prior art is that the sidewall coverage tends to be asymmetric with the side facing the center of the target being more heavily coated than the more shielded side. Not only does this require excessive deposition to achieve a seed layer of predetermined thickness, it causes cross-shaped trenches used as alignment indicia in the photolithography to appear to move as the trenches are asymmetrically narrowed.

Another operational control that promotes deep hole filling is low chamber pressure. At higher pressures, there is a higher probability that sputtered particles, whether neutral or ionized, will collide with atoms of the argon carrier gas. Collisions tend to neutralize ions and to randomize velocities, both effects degrading hole filling. However, as described before, the sputtering relies upon the existence of a plasma at least adjacent to the target. If the pressure is reduced too much, the plasma collapses, although the minimum pressure is dependent upon several factors.

The extreme of low-pressure plasma sputtering is sustained self-sputtering (SSS), as disclosed by Fu et al. in U.S. patent application Ser. No. 08/854,008, filed May 8, 1997. In SSS, the density of positively ionized sputtered atoms is so high that a sufficient number are attracted back to the negatively biased target to resputter more ionized atoms. No argon working gas is required in SSS. Copper is the metal most prone to SSS, but only under conditions of high power and high magnetic field. Copper sputtering is being seriously developed because of copper's low resistivity and low susceptibility to electromigration. However, for copper SSS to become commercially feasible, a full-coverage, high-field magnetron needs to be developed.

Increased power applied to the target allows reduced pressure, perhaps to the point of sustained self-sputtering. The increased power also increases the ionization density. However, excessive power requires expensive power supplies and increased cooling. Power levels in excess of 20 to 30 kW are considered infeasible. In fact, the pertinent factor is the power density in the area below the magnetron since that is the area of the high-density plasma promoting effective sputtering. Hence, a small, high-field magnet would most easily produce a high ionization density. For this reason, apparently, some prior art discloses a small circularly shaped magnet. However, such a magnetron requires not only rotation about the center of the target to provide uniformity, but it also requires radial scanning to assure full and fairly uniform coverage of the target. If full magnetron coverage is not achieved, not only is the target not efficiently used, but more importantly the uniformity of sputter deposition is degraded, and some of the sputtered material redeposits on the target in areas that are not being sputtered. The redeposited material builds up to such a thickness that it is prone to flake off, producing severe particle problems. While radial scanning can potentially avoid these problems, the mechanisms are complex and generally considered infeasible.

One type of commercially available magnetron is kidney-shaped, as exemplified by Tepman in U.S. Pat. No. 5,320,728. Parker discloses more exaggerated forms of this shape in U.S. Pat. No. 5,242,566. As illustrated in plan view in FIG. 3, the Tepman magnetron 52 is based on a kidney shape for the magnetically opposed pole faces 54, 56 separated by a circuitous gap 57 of nearly constant width. The pole faces 54, 56 are magnetically coupled by unillustrated horseshoe magnets. The magnetron rotates about a rotational axis 58 at the center of the target 14 and near the concave edge of the kidney-shaped inner pole face 54. The curved outer periphery of the outer pole face 56, which is generally parallel to the gap 57 in that area, is close to the outer periphery of the usable portion if the target 14. This shape has been optimized for high field and for uniform sputtering but has an area that is nearly half that of the target. It is noted that the magnetic field is relatively weak in areas separated from the pole gap 57.

For these reasons, it is desirable to develop a small, high-field magnetron providing full coverage so as to promote deep hole filling and sustained copper self-sputtering.

SUMMARY OF THE INVENTION

The invention includes a sputtering magnetron having an oval or related shape of smaller area than a circle of equal diameter where the two diameters extend along the target radius with respect to the typical rotation axis of the magnetron. The shapes include racetracks, ellipses, egg shapes, triangles, and arced triangles. The magnetron is rotated on the backside of the target about a point preferably near the magnetron's thin end and the thicker end is positioned more closely to the target periphery.

The invention also includes sputtering methods achievable with such a magnetron.

Many metals not subject to sustained self-sputtering can be sputtered at chamber pressures of less than 0.5 milliTorr, often less than 0.2 milliTorr, and even at 0.1 milliTorr. The bottom coverage can be further improved by applying an RF bias of less than 250 W to a pedestal electrode sized to support a 200 mm wafer. Copper can be sputtered with 18 kW of DC power for a 330 mm target and 200 mm wafer either in a fully self-sustained mode or with a minimal chamber pressure of 0.3 milliTorr or less.

DETAILED DESCRIPTION OF THE PREFERRED EMBODIMENT

Figure 4:
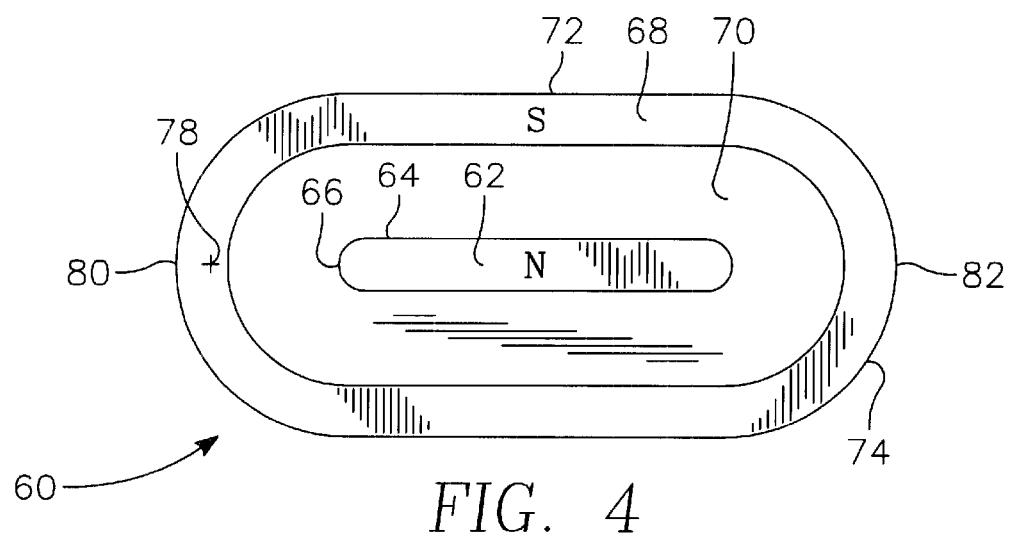
FIG. 4 is a plan view of the pole pieces of an embodiment of the magnetron of the invention taken along the view line 4—4 of FIG. 6.

One embodiment of the invention is a racetrack magnetron 60, illustrated in plan view in FIG. 4, having a central bar-shaped pole face 62 of one magnetic polarity having opposed parallel middle straight sides 64 connected by two rounded ends 66. The central pole face 62 is surrounded by an outer elongated ring-shaped pole face 68 of the other polarity with a gap 70 between them. The outer pole face 68 of the other magnetic polarity includes opposed parallel middle straight sections 72 connected by two rounded ends 74 in general central symmetry with the inner pole face 62. The middle sections 72 and rounded ends 74 are bands having nearly equal widths. Magnets, to be described shortly, cause the pole faces 62, 68 to have opposed magnetic polarities. A backing plate, also to be described shortly, provides both a magnetic yoke between the pole faces 62, 68 and support for the magnetron structure.

Although the two pole faces 62, 68 are illustrated with specific magnetic polarities producing magnetic fields extending generally perpendicularly to the plane of illustration, it is of course appreciated that the opposite set of magnetic polarities will produce the same general magnetic effects as far as the invention is concerned. This assembly produces a generally semi-toroidal field extending perpendicularly to a closed path with a minimal field-free region in the center. It is intended that the pole assembly of FIG. 4 be rotated about a rotation axis 78 approximately coincident with the center of the target 14 and located at or near one prolate end 80 of the outer pole face 68 and with its other prolate end 82 located approximately at the outer radial usable extent of the target 14, thereby achieving full target coverage. The outer usable periphery of the target is not easily defined because different magnetron designs use different portions of the same target. However, it is bounded by the flat area of the target and almost always extends to significantly beyond the diameter of the wafer being sputter deposited and is somewhat less than the area of the target face. For 200 mm wafers, target faces of 325 mm are typical. A 15% unused target radius may be considered as an upper practical limit.

Figure 5:
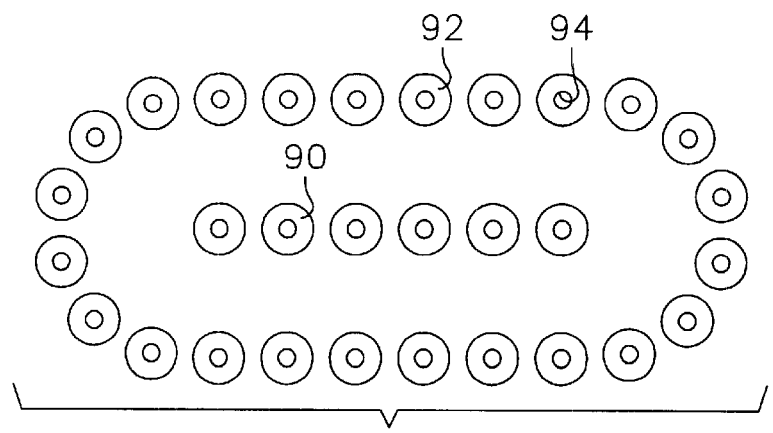
FIG. 5 is a plan view of the magnets used in the magnetron of FIG. 4.
Figure 6:
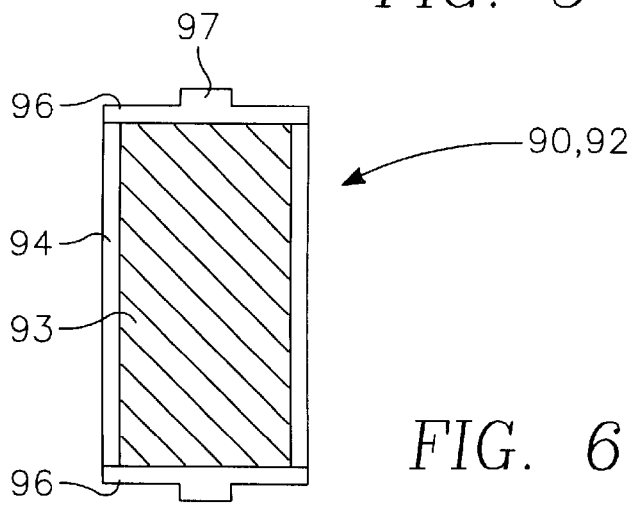
FIG. 6 is a cross-sectional view of one of the magnets used in conjunction with the embodiments of the invention.

As illustrated in the plan view of FIG. 5, two sets of magnets 90, 92 are disposed in back of the pole faces 62, 68 to produce the two magnetic polarities. The magnets 90, 92 are of similar construction and composition producing an axially extending magnetic flux on each vertically facing end. A cross-sectional view of a magnet 90, 92 is shown in FIG. 6. A cylindrical magnetic core 93 extending along an axis is composed of a strongly magnetic material, such as neodymium boron iron (NdBFe). Because such a material is easily oxidized, the core 93 is encapsulated in a case made of a tubular sidewall 94 and two generally circular caps 96 welded together to form an air-tight canister. The caps 96 are composed of a soft magnetic material, preferably SS410 stainless steel, and the tubular sidewall 96 is composed is composed of a non-magnetic material, preferably SS304 stainless steel. Each cap 96 includes an axially extending pin 97, which engages a corresponding capture hole in one of the pole faces 62, 68 or in a magnetic yoke to be shortly described. Thereby, the magnets 90, 92 are fixed in the magnetron. The magnetic core 93 is magnetized along its axial direction, but the two different magnets 90, 92 are oriented in the magnetron 60, as illustrated in the cross-sectional view of FIG. 7, so that the magnets 90 of the inner pole 62 are aligned to have their magnetic field extending vertically in one direction, and the magnets 92 of the outer pole 68 are aligned to have their magnetic field extending vertically in the other direction. That is, they have opposed magnetic polarities.

Figure 7:
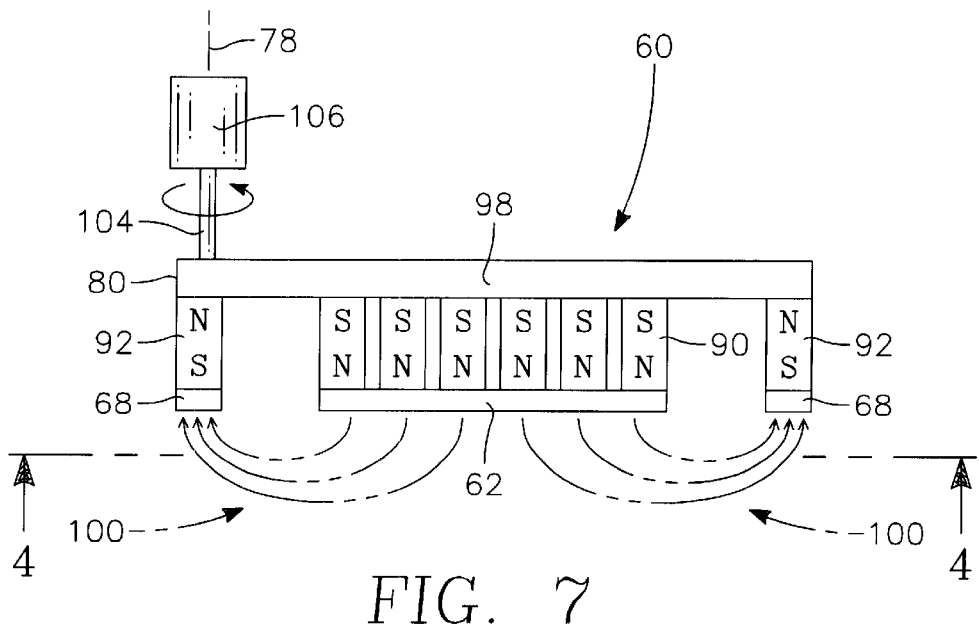
FIG. 7 is a cross-sectional view of the magnetron of FIG. 4.

As illustrated in the cross-sectional view of FIG. 7, the magnets 90, 92 are arranged closely above (using the orientation of FIG. 1) the pole faces 62, 68 located just above the back of the target 14. A magnetic yoke 98 having a generally closed shape generally conforming to the outer periphery of the outer pole face 68 is closely positioned in back of the magnets 90, 92 to magnetically couple the two poles 62, 68. As mentioned previously, holes in the pole faces 62, 68 and in the yoke 98 fix the magnets 90, 92.

The inner magnets 90 and inner pole face 62 constitute an inner pole of one magnetic polarity while the outer magnets 92 and the outer pole face 62 constitute a surrounding outer pole of the other magnetic polarity. The magnetic yoke 98 magnetically couples the inner and outer poles and substantially confines the magnetic field on the back or top side of the magnetron to the yoke 98. A semi-toroidal magnetic field 100 is thereby produced, which extends through the non-magnetic target 14 into the vacuum chamber 12 to define the high-density plasma region 38. The field 100 extends through the non-magnetic target 14 into the vacuum chamber 12 to define the extent of the high-density plasma region 38. As illustrated, the magnetron 60 extends horizontally from approximately the center of the target 14 to the edge of the usable area of the target 14. The magnetic yoke 90 and the two pole faces 62, 68 are preferably plates formed of a soft magnetic material such as SS416 stainless steel.

The inner prolate end 80 of the magnetron 60 is connected to a shaft 104 extending along the rotation axis 78 and rotated by a motor 106. As illustrated, the magnetron 60 extends horizontally from approximately the center of the target 14 to the right hand side of the usable area of the target 14. Demaray et al. in U.S. Pat. No. 2,252,194 disclose exemplary details of the connections between the motor 106, the magnetron 60, and the vacuum chamber 12. The magnetron assembly 60 should include counter-weighting to avoid flexing of the shaft 104. Although the center of rotation 78 is preferably disposed within the inner prolate end 74 of the outer pole face 72, its position may be optimized to a slightly different position, but one preferably not deviating more than 20% from the inner prolate end 80 as normalized to the prolate length of the magnetron 60.

The racetrack configuration of FIG. 4 can be alternatively characterized as an extremely flattened oval. Other oval shapes are also included within the invention, for example, elliptical shapes with the major axis of the ellipse extending along the radius of the target and with the minor axis preferably parallel to a rotational circumference.

Figure 8:
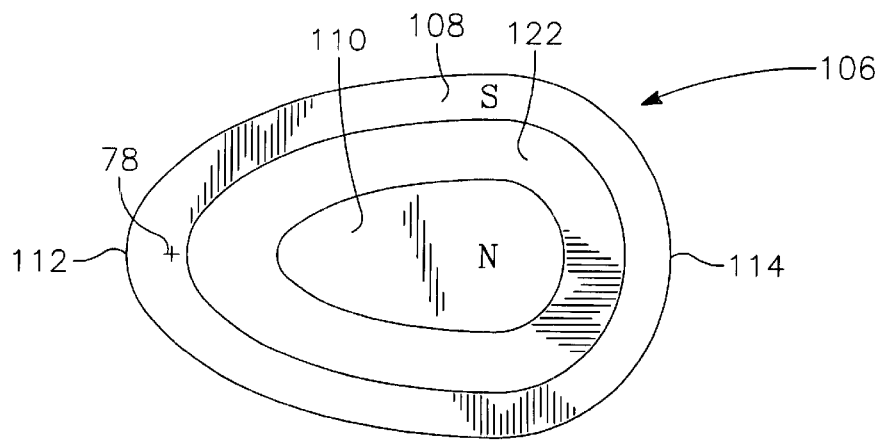
FIG. 8 is a plan view of an egg-shaped magnetron.

Another oval shape is represented by an egg-shaped magnetron 106, illustrated in plan view in FIG. 8, having an outer pole face 108 of one magnetic polarity surrounding an inner pole face 110 of the other polarity with a gap 122 between them. Both pole faces 108, 110 are shaped like the outline of an egg with a major axis extending along the radius of the target. However, an inner end 112 of the outer pole face 108 near the rotation axis 78 is sharper than an outer end 114 near the periphery of the target. The egg shape is approximately elliptical but is asymmetric with respect to the target radius. Specifically, the minor axis is pushed closed to the target periphery. The inner pole face 110 and the gap 122 are similarly shaped.

Figure 9:
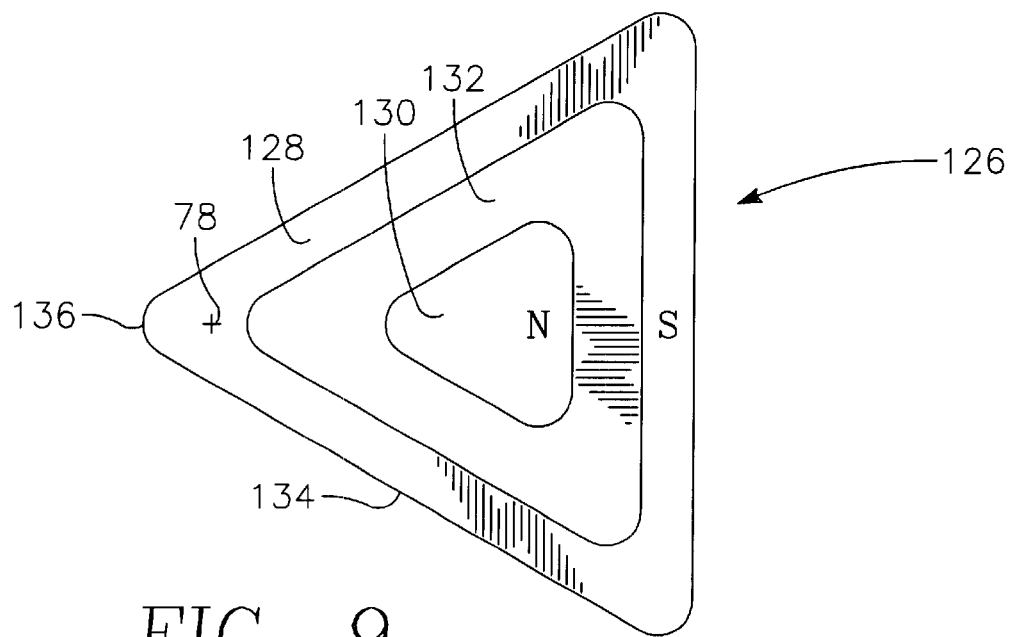
FIG. 9 is a plan view of a triangularly shaped magnetron.

A related shape is represented by a triangular magnetron 126, illustrated in plan view in FIG. 9, having a triangular outer pole face 128 of one magnetic polarity surrounding a substantially solid inner pole face 130 of the other magnetic polarity with a gap 132. The triangular shape of the inner pole face 130 with rounded corners allows hexagonal close packing of the button magnets. The outer pole face 128 has three straight sections 134 are preferably offset by 60° with respect to each other and are connected by rounded corners 136. Preferably, the rounded corners 136 have smaller lengths than the straight sections 134.

Figure 10:
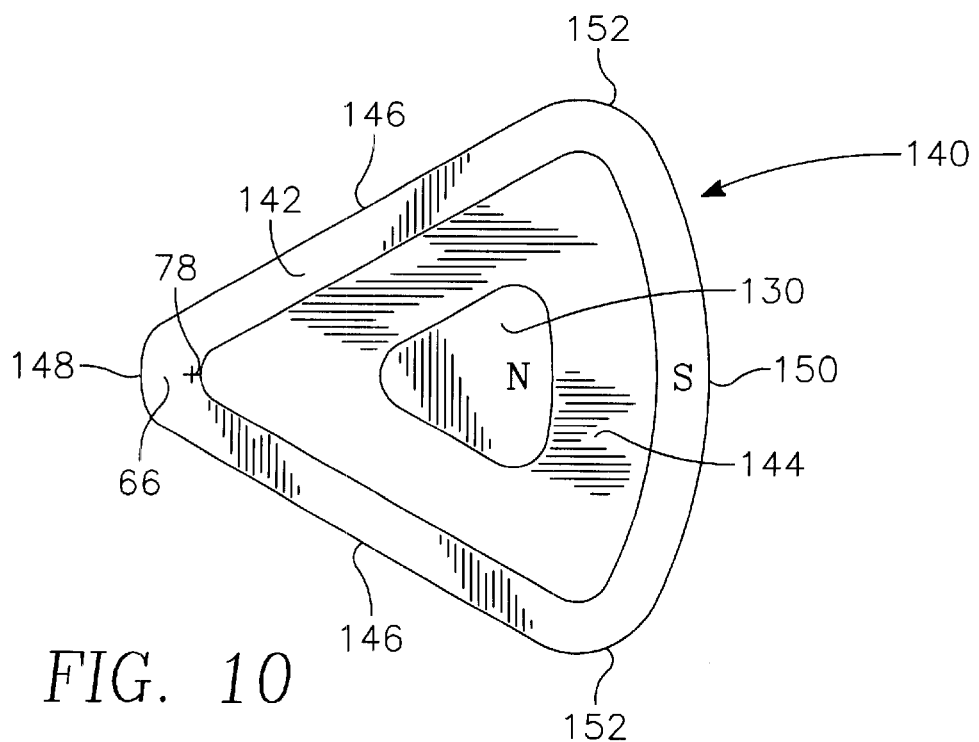
FIG. 10 is a plan view of a modification of the triangularly shaped magnetron of FIG. 9, referred to as an arced triangular magnetron.

A modified triangular shape is represented by an arced triangular magnetron 140 of FIG. 10. It includes the triangular inner pole face 130 surrounded by an arced triangular outer pole face 142 with a gap 144 between them and between the magnets of the respective poles and with the magnetic yoke in back of the gap 144. The outer pole face 142 includes two straight sections 146 connected to each other by a rounded apex corner 148 and connected to an arc section 150 by rounded circumferential corners 152. The rotational center 78 is located near the apex corner 148. The arc section 150 is located generally near the circumferential periphery of the target. It curvature may be equal to that of the target, that is, be equidistant from the center of rotation 78, but other optimized curvatures may be chosen for an arc section concave with respect to the rotational center 78.

Figure 11:
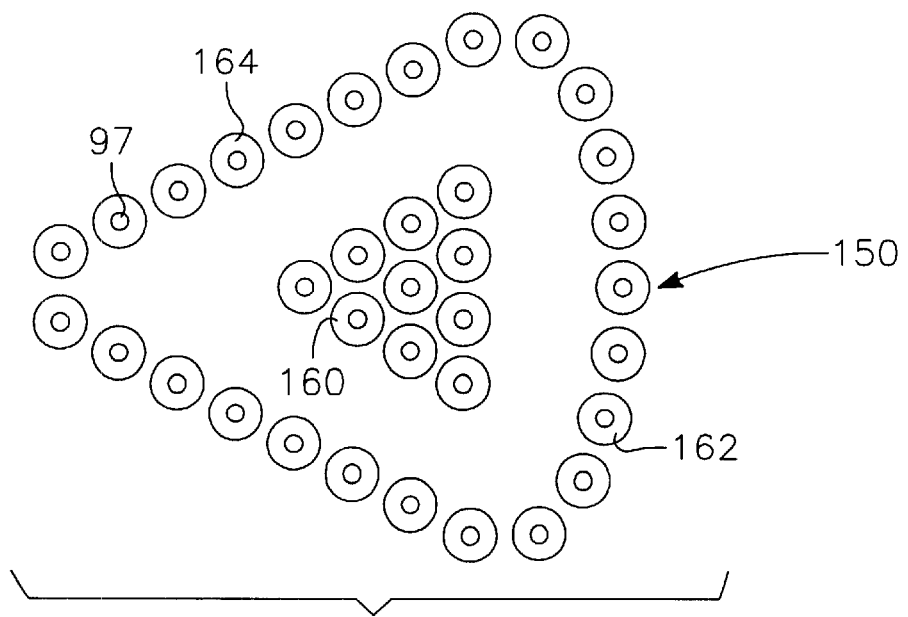
FIG. 11 is a plan view of the magnets used in the arced triangular magnetron of FIG. 10.

The magnetic field is produced by an arrangement of magnets shown in plan view in FIG. 11. Magnets 160 of a first polarity are disposed in a hexagonally close-packed arrangement adjacent to the inner pole face 130. Magnets 162 of a second polarity are arranged adjacent to the arc section 150 of the outer pole face 142 while magnets 164 of the second polarity are arranged adjacent to the remaining portions of the outer pole face 142. In some situations, to be described later, it is advantageous to place magnets of different intensities at different portions of the outer pole face 142. In one embodiment, there are 10 magnets in the inner pole and 26 magnets in the outer pole, which for magnets of equal strength produces 2.6 more magnetic flux in the outer pole than in the inner pole.

Figure 12:
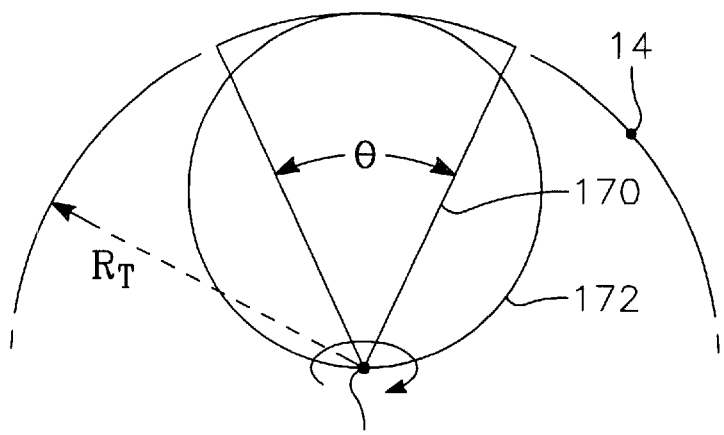
FIG. 12 is a plan view of two model magnetrons used to calculate areas and peripheral lengths.
Figure 13:
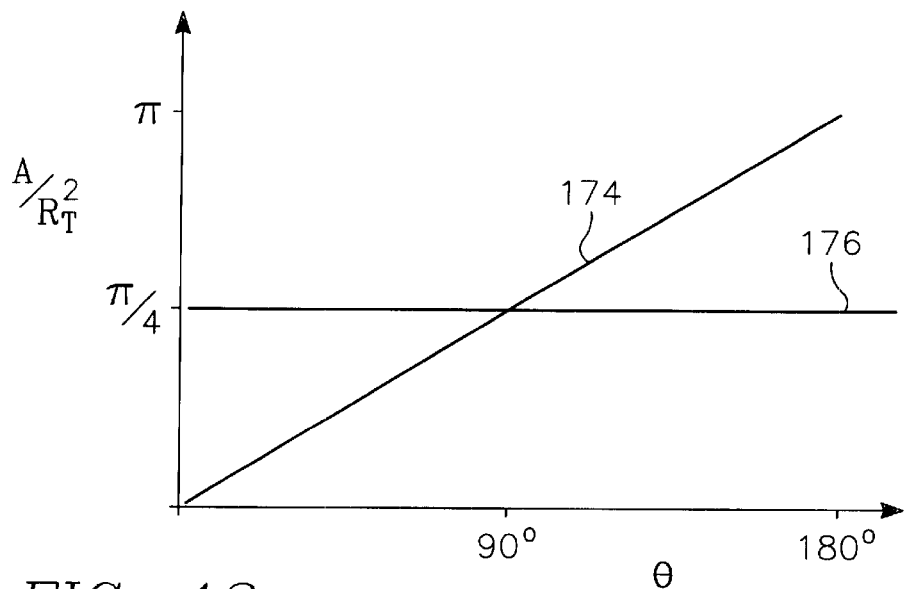
FIG. 13 is a graph of the angular dependences of the areas of a triangular and of a circular magnetron.
Figure 14:
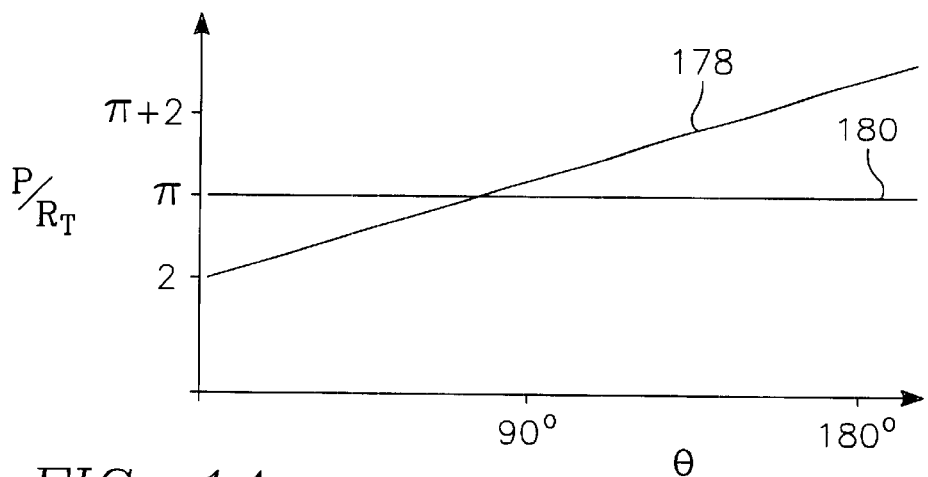
FIG. 14 is a graph of the angular dependences of the peripheral lengths of the two types of magnetrons of FIG. 12.

The triangular magnetrons 126, 140 of FIGS. 9 and 10 are illustrated as having apex angles θ of 60°, but the apex angle can be changed, in particular decreased below 60°, although 60°±15° seems to provide superior uniformity. The apex angle significantly affects two important parameters of the magnetron of the invention, the values of its area A and its perimeter P. Some simple calculations, most easily done for the arced triangular magnetron 140, show the general effects of changing the apex angle θ, as illustrated in plan view in FIG. 12. A simplified arced triangular magnetron 170 has two straight sides extending between the center and periphery of the target 14 of radius $R_T$ and meeting at an apex coincident with the rotation axis 78 and further includes an arc side conforming to the usable periphery of the target 14. The area A of the simplified arced triangular magnetron 170 is $\theta R_T^2$, and its periphery P is $R_T(2+\theta)$, where θ is measured in radians. Also illustrated in FIG. 12 is a circular magnetron 172 having a radius of $R_T/2$ and having a diameter fixed to the rotation axis 78. It has an area A of $\pi R_T^2/4$ and a periphery P of $\pi R_T$. Both magnetrons 170, 172 provide full target coverage. The dependence of the arced triangular area A upon the apex angle θ is plotted in normalized units in FIG. 13 by line 174 and that for the circular area by line 176. Below 45°, the triangular area is smaller. The dependence of the triangular periphery P is plotted in FIG. 14 by line 178 and that for the circular periphery by line 180. Below 65.4°, the arced triangular periphery is smaller. Ionization efficiency is increased by minimizing the area, since the target power is concentrated in a smaller area, and is also increased by minimizing the periphery, since edge loss is generally proportional to the peripheral length. Of course, the area needs to be large enough to accommodate the magnets creating the magnetic field. Also, these calculations do not address uniformity.

The shapes presented above have all been symmetric about the target radius. However, the magnetron of the invention includes asymmetric shapes, for example one radially extending side being in the form of the racetrack of FIG. 4 and the other side being oval, e.g., the egg shape of FIG. 7, or one radially extending side being oval or straight and the other side having a triangular apex between the center and periphery of the target.

Figure 15:
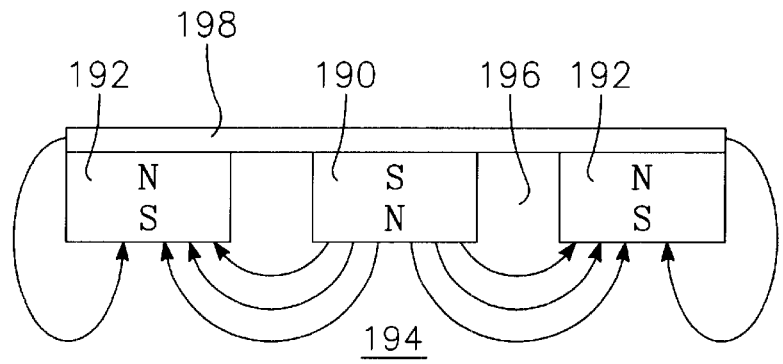
FIG. 15 is a side view of an idealization of the magnetic field produced with the described embodiments of the invention.

All the magnetrons described above have asymmetric inner and outer poles. In particular, the total magnetic flux ∫B·dS produced by the inner pole 190, illustrated schematically in FIG. 15, is much less than that produced by the surrounding outer pole 192, for example, by at least a factor of 1.5 and preferably 2. All the magnetrons are also characterized as having a compact inner pole 190 surrounded by the outer pole 192. The result is a magnetic field distribution which is very strong in the reactor processing area 194 adjacent to the gap 196 between the poles 190, 192, but which also extends far into the processing area 194 as the magnetic field lines of the outer pole 192 close back to the magnetic yoke 198. The substantial fraction of magnetic field extending vertically from the target deep into the processing area 194 helps to support a sustained self-sputtering plasma deep into the processing area 194 and to guide ionized sputtered particles toward the wafer.

The inventive magnet achieves a relatively high magnetic field. However, magnetic field intensity of itself is insufficient. Some conventional magnetrons, such as Demaray et al. disclose in the aforecited patent, use a line of horseshoe magnets arranged in a kidney-shaped linear path with only a small gap between the poles of the horseshoes. As a result, a relatively high magnetic field intensity can be achieved in the area at the periphery of the kidney shape. However, the linear shape of the high magnetic field surrounds an area of substantially no magnetic field. As a result, electrons can escape to not only the exterior but also the interior of the high-field region. In contrast, the inner pole of the triangular magnetron of the invention produces a magnetic cusp of minimal area. If electrons are lost from the magnetic field on one side of the inner pole, they are likely to be captured on the other side, thus increasing the plasma density for a given power level. Furthermore, the inner pole includes a single magnetizable pole face producing a generally uniform magnetic flux. If multiple inner poles faces were used for multiple inner magnets, magnetic field lines would extend to between the inner magnets.

A further advantage of the inventive design is that one pole is formed in a closed line and surrounds the other pole. It would be possible to form a very small linearly extending magnetron with high magnetic field intensity by arranging horseshoe magnets or the like in an open ended line with the two sets of poles being closely spaced. However, the electrons could then easily escape from the open ends and decrease the density of the plasma.

It is understood that the shapes described above refer to pole faces having band-like widths of area not significantly larger than the button magnets being used. The widths, particularly of the outer pole face, can be increased, perhaps even non-uniformly, but the additional width is of less effectiveness in generating the desired high magnetic field.

It is believed that the beneficial results of the invention are achieved in large part because the oval magnetrons and magnetrons of related shapes produce a higher plasma ionization density without requiring excessive power. Nonetheless, full target coverage is achieved. In one aspect, the inventive magnetron has a relatively small area, but has a shape that allows full target coverage without radial scanning. The triangular magnetron 160 of FIG. 10 with an apex angle of 60° has an area of ⅙ (0.166) of the usable target area. In contrast, if the circular magnetron 162 were used, which similarly extends from the target center to the periphery, the magnetron area is ¼ (0.25) of the target area. As a result, the power density is less for a given power supply powering a larger circular magnetron. The target overlay percentage is even higher for the Tepman magnet of FIG. 3.

The combination of small area and full coverage is achieved by an outer magnetron shape extending from the target center to its usable periphery (±15%) and having a transverse dimension at half the target radius of less substantially less than the target radius, that is, prolate along the target radius. The transverse dimension should be measured circumferentially along the rotation path.

The uniformity is enhanced by an oval shape that is transversely wider, with a respect to the target radius, at its outer end near the target periphery than at its inner end near the center of rotation. That is, the minor axis is displaced towards the target circumference.

Processes

An arced triangular magnetron of the invention was tested in several experiments. For almost all the experiments, the target was spaced between 190 and 200 mm from the wafer and the target had a diameter of 330 mm for a 200 mm wafer.

For copper sputtering, uniformity is improved by using ten strong magnets 160 in the inner pole, strong magnets 162 along the arc portion 150 of the outer pole, and weaker magnets 164 for the remainder of the outer pole. The stronger magnets have a diameter 30% larger than the diameter of the weaker magnets, but are otherwise of similar composition and structure, thereby creating an integrated magnetic flux that is 70% larger.

Sustained self-sputtering of copper is achieved, after striking the plasma in an argon ambient, with 9 kW of DC power applied to the target having a usable diameter of about 30 cm. However, it is considered desirable to operate with 18 kW of DC power and with a minimal argon pressure of about 0.1 milliTorr arising at least in part from leakage of the gas providing backside cooling of the wafer to the liquid-chilled pedestal. The increased background pressure of 0.1 to 0.3 milliTorr enhances effective wafer cooling without significant increase in the scattering and deionization of the sputtered ions. These relatively low DC powers are important in view of the ongoing development of equipment for 300 mm wafers, for which these numbers scale to 20 kW and 40 kW. A power supply of greater than 40 kW is considered expensive if not infeasible.

One application of ionized copper sputtering is to deposit a thin conformal seed layer in a deep and narrow via hole. Thereafter, electro or electroless plating can be used to quickly and economically fill the remainder of the hole with copper.

In one experiment, a via hole having a top width of 0.30 µm and extending through 1.2 µm of silica was first coated with a Ta/TaN barrier layer. Copper was deposited over the barrier layer at 18 kW of target power and a pressure of 0.2 milliTorr to a blanket thickness of about 0.18 µm. The sides of the via hole was smoothly covered. The sidewall thickness of the copper was about 7 nm on one side and 11.4 nm on the other side for a via located at the wafer edge. The bottom thickness was about 24 nm. Sidewall symmetry was improved for a via hole at the wafer center. The smoothness promotes the use of the deposited layer as a seed layer and as an electrode for subsequent electroplating of copper. The relatively good symmetry between the two sidewalls relieves the problem in the prior art of moving photolithographic indicia.

Sputtering of an aluminum target was achieved at both 12 kW and 18 kW of applied power with a minimum pressure of about 0.1 milliTorr, a significant improvement. For aluminum sputtering, sidewall coverage and particularly bottom coverage were significantly improved. The better uniformity is also believed to be related in part to the increased ionization fraction since the self-biased pedestal supporting the wafer attracts the ionized sputtered particles across its entire area. It is estimated that the magnetron of the invention increases the ionization fraction from 2% to at least 20% and probably 25%.

Figure 3:
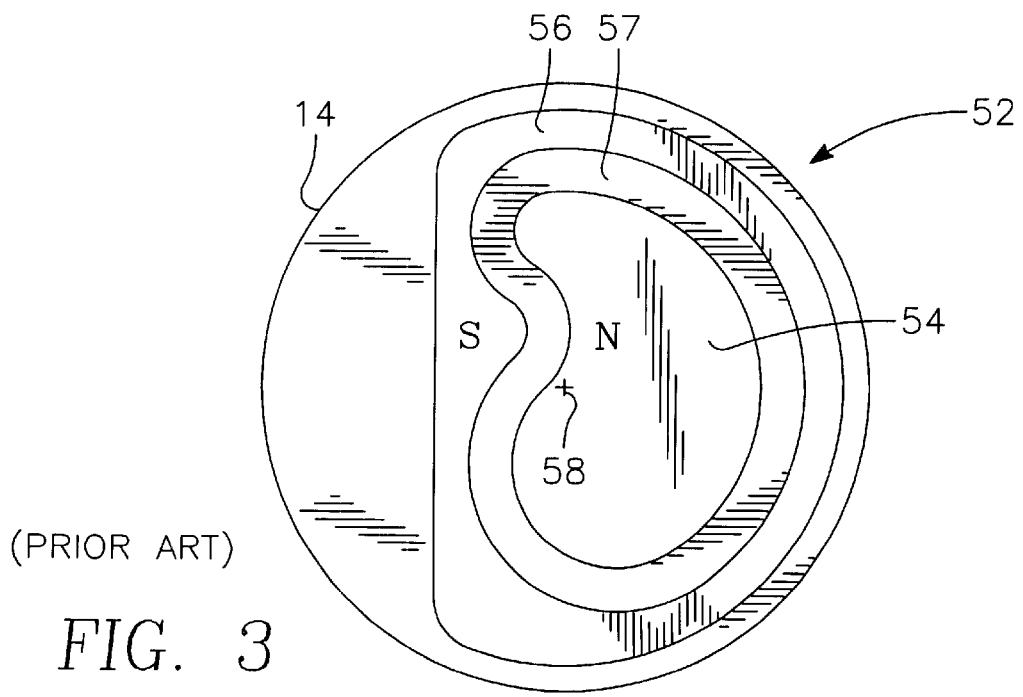
FIG. 3 is a plan view of a conventional magnetron.

The arced triangular magnetron was compared under similar operating conditions to the operation of a conventional magnetron resembling the Tepman magnetron of FIG. 3. The comparative results are summarized in TABLE 1 for the sputtering of aluminum.

TABLE 1

|  | Triangle | Conv. |
| --- | --- | --- |
| Bottom Coverage | 28.5% | 8.0% |
| Sidewall Coverage | 8.0% | 5.7% |
| Uniformity (190 mm) | 4.6% | 7.8% |
| Uniformity (290 mm) | 3.0% | 6.0% |
| Minimum Pressure (milliTorr) | 0.1 | 0.35 |

The coverage results were obtained for via holes having a width of 0.25 µm and a depth of 1.2 µm, that is, an aspect ratio of about 5. The bottom coverage is significantly improved with the inventive triangular magnetron compared to the conventional magnetron. The sidewall coverage is also increased, and further the coverage is smooth and uniform from top to bottom. These two characteristics promote the use of the deposited metal layer as a seed layer for a subsequent deposition step. This is particularly important for copper in which the second deposition is performed by a different process such as electroplating. The increased bottom and sidewall coverages are believed to be due to the higher ionization fraction of sputtered aluminum atoms achieved with the inventive triangular magnetron. This ionization fraction is believed to be 25% or greater. The uniformity of blanket (planar) deposition was determined both for a separation of 190 mm between the target and the wafer and, in a long-throw implementation, for a separation of 290 mm. The inventive triangular magnetron produces better uniformity, especially for long throw. The better uniformity is also believed to be related to the increased ionization fraction since the self-biased pedestal supporting the wafer attracts the ionized sputtered particles across its entire area. Similarly, the inventive triangular magnetron produces less asymmetry between the coverages of the two opposed sidewalls. The increased ionization density is due in part to the relatively small inner yoke having an area substantially less than that of the outer yoke. As a result, electrons lost from one side of the inner yoke are likely to be captured by the other side.

The arced triangular magnetron was also used to sputter titanium. Titanium, sometimes in conjunction with titanium nitride, is useful in aluminum metallization for providing a silicided contact to silicon at the bottom of a contact hole and to act as barrier both to the silicon in a contact hole and between the aluminum and the silica dielectric on the via or contact sidewalls. Conformal and relatively thick coatings are thus required.

A series of experiments were performed using a titanium target with 18 kW of DC target power and with only six magnets 160 in the inner pole. At a chamber pressure of 0.35 milliTorr, the bottom coverage and uniformity are observed to be good.

The titanium experiments were continued to measure bottom coverage as a function of the aspect ratio (AR) of the via hole being coated. With no wafer bias applied and the pedestal heater 18 left electrically floating, the 18 kW of target power nonetheless self-biases the target to about 30 to 45V. The bottom coverage under these conditions is shown by line 190 in the graph of FIG. 15. The bottom coverage decreases for holes of higher aspect ratios but is still an acceptable 20% at AR=6.

Figure 1:
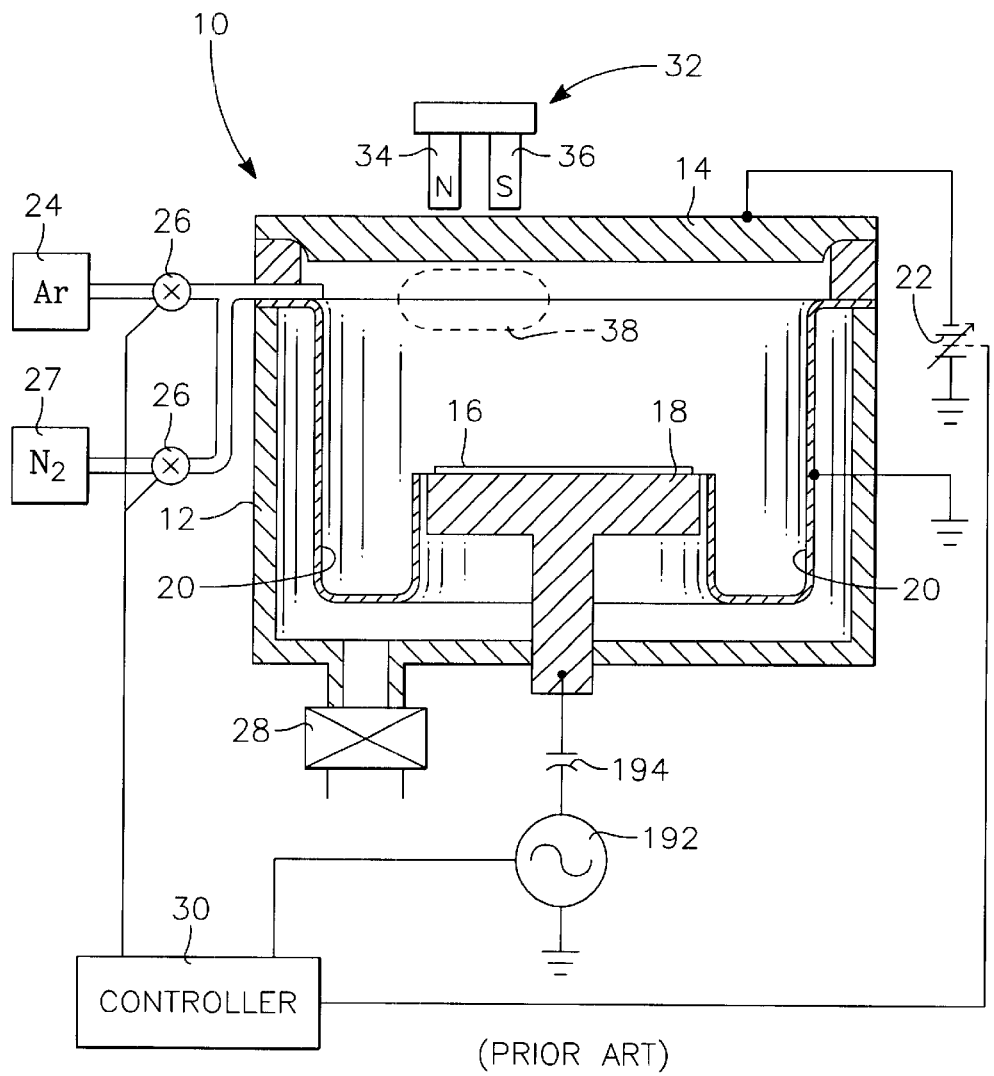
FIG. 1 is a schematic diagram of a DC plasma sputtering reactor.
Figure 2:
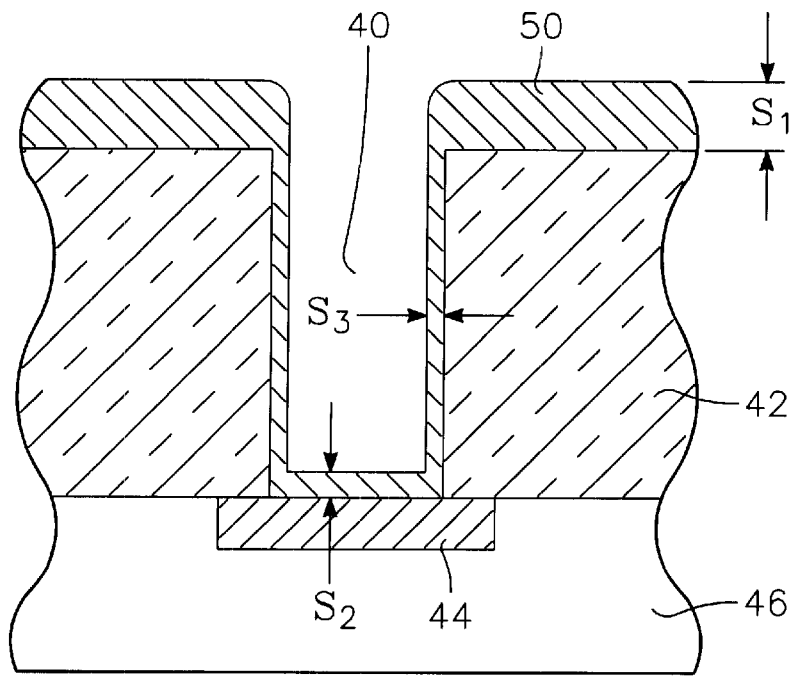
FIG. 2 is a cross-sectional view of a inter-level via in a semiconductor integrated circuit.
Figure 16:
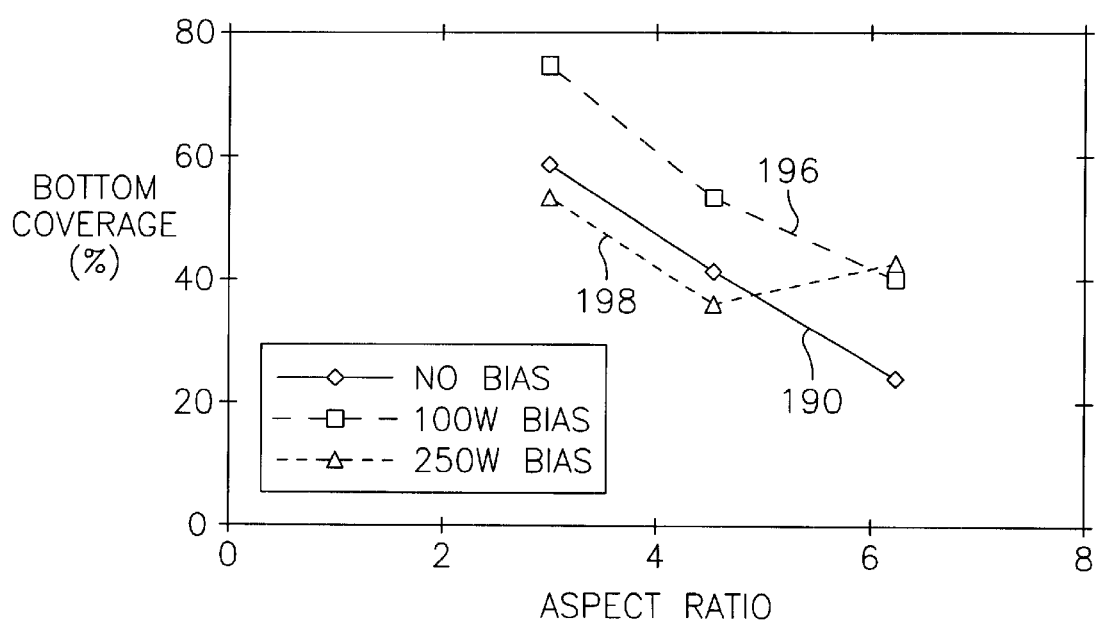
FIG. 16 is a graph showing the effect of RF wafer bias in bottom coverage in titanium sputtering.

In a continuation of these experiments, an RF power source 192, illustrated in FIG. 1, was connected to the heater pedestal 18 through a coupling capacitor circuit 194. It is known that such an RF field applied to the wafer adjacent to a plasma creates a DC self-bias. When 100 W of 400 kHz power is applied, the bottom coverage is significantly increased, as shown by line 196 in the graph of FIG. 16. These powers should be normalized to a 200 mm circular wafer. However, when the bias power is increased to 250 W, resputtering and faceting of the top corners of the via hole becomes a problem. The bottom coverage results for 250 W bias are shown by line 198. They are generally worse than for 100 W of wafer bias. A higher bias frequency of 13.56 MHz should provide similar results.

The magnetron of the invention can also be used for reactive sputtering, such as for TiN, in which nitrogen is additionally admitted into the chamber to react with the sputtered metal, for example, with titanium to produce TiN or with tantalum to produce TaN. Reactive sputtering presents a more complex and varied chemistry. Reactive sputtering to produce TiN is known to operate in two modes, metallic mode and poison mode. Metallic mode produces a high-density, gold-colored film on the wafer. Poison mode, which is often associated with a high nitrogen flow, produces a purple/brown film which advantageously has low stress. However, the poison-mode film has many grain boundaries, and film defects severely reduce chip yield. Furthermore, the deposition rate in poison mode is typically only one-quarter of the rate in metallic mode. It is generally believed that in poison mode the nitrogen reacts with the target to form a TiN surface on the Ti target while in metallic mode the target surface remains clean and TiN forms only on the wafer.

Figure 17:
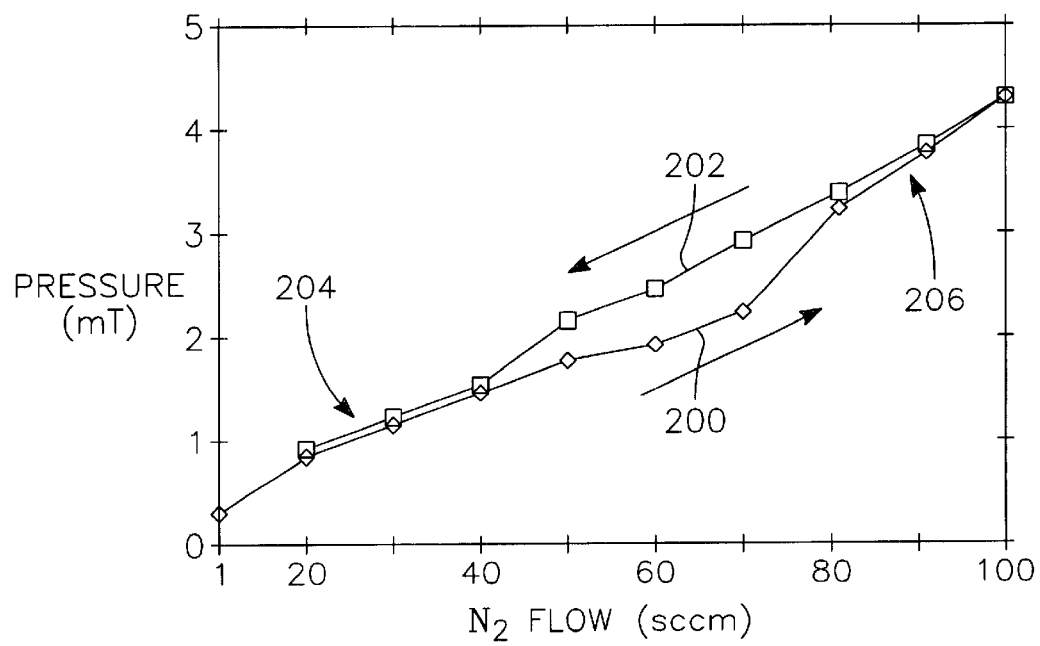
FIG. 17 is a graph of the dependence of chamber pressure upon nitrogen flow illustrating the two modes of deposition obtained in reactive sputtering of titanium nitride with a magnetron of the invention.

The arced triangular magnetron was used for reactive sputtering of titanium nitride. The initialization conditions are found to be very important to obtain operation in metallic mode. In a series of initial experiments, argon alone is first admitted to the chamber. After the plasma is struck at an argon pressure of about 0.5 milliTorr, the argon flow is reduced to 5 sccm producing a pressure of 0.3 milliTorr. When the nitrogen flow is then step wise ramped up to 100 sccm and then is gradually reduced, the dependence of the chamber pressure upon the flow assumes a hysteretic form illustrated in FIG. 17. Between about 50 and 70 sccm of nitrogen, intermediate ramp-up pressures 200 are below corresponding intermediate ramp-down pressures 202. At lower pressures 204 and at higher pressures 206, there is no significant separation between ramp up and ramp down. It is believed that the lower pressures 204 and intermediate ramp-up pressures 200 cause sputtering in metallic mode while higher pressures 206 and intermediate ramp-down pressures 202 cause sputtering in poison mode.

These results show that, for higher operational deposition rates in the generally preferred metallic mode, it is important to not exceed the intermediate ramp-up pressures 200, that is, not to exceed the maximum metallic-mode flow, which in these experiments is 70 sccm or slightly higher but definitely below 80 sccm. The argon and nitrogen can be simultaneously and quickly turned on, but preferably the DC power is also quickly turned on.

There are some applications, however, where operation in poison mode is preferred. This can be achieved by first going to the higher pressures 206 and then decreasing to the ramp-down intermediate pressures 202. Alternatively, poison mode can be achieved by immediately turning on the desired gas flow, but only gradually turning on the DC sputtering power supply at a rate of no more than 5 kW/s.

Figure 18:
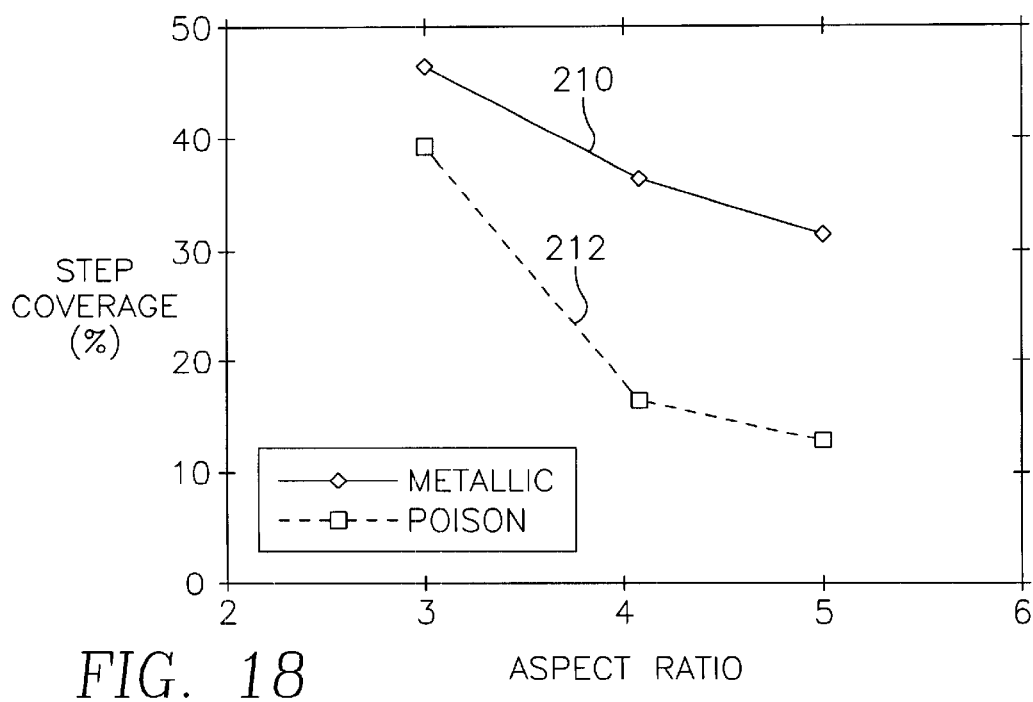
FIG. 18 is a graph of the step coverage obtained in the two sputtering modes for reactive sputtering of titanium nitride with a magnetron of the invention.

Titanium nitride was sputtered into high aspect-ratio via holes in both metallic and poison modes at a $N_2$ flow of 50 sccm and an Ar flow of 5 sccm after the plasma had been struck in argon. These flows produce a pressure of 1.7 milliTorr in metallic mode and 2.1 milliTorr in poison mode. The deposition rates are 100 nm/min in metallic mode and 30 nm/min in poison mode. On one hand, the TiN film stress is higher when it is deposited in metallic mode, but on the other hand poison mode suffers from overhang and undulatory sidewall thicknesses near the top of the via hole. A series of experiments deposited TiN into via holes of differing aspect ratios. The resulting measured bottom coverage, illustrated in the graph of FIG. 18, shows in line 210 that bottom coverage in metallic mode remains relatively high even with an via aspect ratio of 5 while in line 212 the step coverage in poison mode is always lower and drops dramatically for aspect ratios of four and higher.

The inventive magnetron can also be used to sputter deposit other materials, for example, W using a tungsten target, or TaN, using a tantalum target and nitrogen gas in the plasma. Reactive sputtering of WN is also contemplated.

The magnetron of the invention is thus efficient in producing a high ionization fraction because of the high-density plasma it can create without excessive power being required. Nonetheless, its full coverage allows for uniform deposition and full target utilization. Its sputtering uniformity is good. Nonetheless, no complex mechanisms are required.

Such a small, high-field magnet enables sustained self-sputtering with relatively modest target power and also enables sputtering of materials such as aluminum and titanium at reduced pressures below 0.5 milliTorr, preferably below 0.2 milliTorr, and even at 0.1 milliTorr. At these pressures, deep hole filling can be facilitated by the reduced scattering of sputtered particles, whether neutral or ionized, and by the reduced neutralization of ionized particles. The high-field magnet further promotes a high ionization fraction, which can be drawn into a deep, narrow hole by biasing of the wafer within proper ranges.

What is claimed is:

1. A magnetron assembly positionable at a backside of a sputtering target and rotatable about a center position of said target, comprising:
   a plurality of first permanent magnets of a first magnetic polarity;
   a first pole of said first magnetic polarity formed on a side of said first permanent magnets facing said backside and comprising a closed band having a central aperture extending a first distance from said center of said target toward a circumferential periphery of said target and producing a first total magnetic flux;
   at least one second permanent magnet of a second magnetic polarity; and
   a second pole of said second magnetic polarity formed on a side of said at least one second permanent magnet facing said backside, disposed in said aperture, and separated from said first pole by a gap extending along a surface of said target and producing a second total magnetic flux;
   wherein a ratio of said first magnetic flux to said second magnetic flux is at least 1.5.

2. The magnetron assembly of claim 1, wherein said first pole includes two straight sections inclined with respect to each other and being closer together nearer said center position than near a periphery of said target.

3. A magnetron assembly positionable at a backside of a sputtering target and rotatable about a center position of said target, comprising:
   a plurality of first permanent magnets of a first magnetic polarity;
   a first pole of said first magnetic polarity comprising said first permanent magnets and arranged in a closed band having a central aperture extending a first distance from said center of said target toward a circumferential periphery of said target and producing a first total magnetic flux, wherein said center position is included within an outer periphery of said first pole;
   at least one second permanent magnet of a second magnetic polarity; and
   a second pole of said second magnetic polarity comprising said at least one second permanent magnet, disposed in said aperture, and separated from said first pole by a gap extending along a surface of said target and producing a second total magnetic flux.

4. The magnetron assembly of claim 3, wherein said closed band overlies said center position.

5. The magnetron assembly of claim 3, wherein a ratio of said first total magnetic flux to said second total magnetic flux is at least 1.5.

6. The magnetron assembly of claim 3, wherein said band includes two straight portions inclined with respect to each other and being closer together toward said center position and farther apart toward a periphery of said target.

7. A magnetron assembly positionable at a backside of a sputtering target and rotatable about a center position of said target, comprising:
   a first pole of a first magnetic polarity comprising a triangularly shaped closed band having a central aperture extending a first distance from said center of said target toward a circumferential periphery of said target and producing a first total magnetic flux, wherein said center position is included within an outer periphery of said first pole between an apex and an opposed base of said triangularly shaped closed band; and
   a second pole of a second magnetic polarity opposite said first magnetic polarity disposed in said aperture and separated from said first pole by a gap extending along a surface of said target and producing a second total magnetic flux.

8. The magnetron assembly of claim 7, wherein said closed band overlies said center position.

9. The magnetron assembly of claim 7, wherein a ratio of said first total magnetic flux to said second total magnetic flux is at least 1.5.

10. The magnetron assembly of claim 7, wherein said first and second poles are at least partially formed by permanent magnets.

11. The magnetron assembly of claim 7, wherein said generally triangularly shaped closed band includes two straight portions extending from said apex to said base and inclined with respect to each other.

* * * * *